United States Patent
Tu et al.

(10) Patent No.: US 12,477,864 B2
(45) Date of Patent: Nov. 18, 2025

(54) PIXEL PACKAGE

(71) Applicant: EPISTAR CORPORATION, Hsinchu (TW)

(72) Inventors: Chao Chi Tu, Hsinchu (TW); Chung Che Dan, Hsinchu (TW); Wei Shan Hu, Hsinchu (TW); Ching Tai Cheng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 310 days.

(21) Appl. No.: 18/138,902

(22) Filed: Apr. 25, 2023

(65) Prior Publication Data
US 2023/0343894 A1 Oct. 26, 2023

(30) Foreign Application Priority Data

Apr. 26, 2022 (TW) .................. 111115811

(51) Int. Cl.
| H10H 20/814 | (2025.01) |
| H01L 25/075 | (2006.01) |
| H10H 20/82 | (2025.01) |
| H10H 20/857 | (2025.01) |

(52) U.S. Cl.
CPC ....... *H10H 20/814* (2025.01); *H01L 25/0753* (2013.01); *H10H 20/82* (2025.01); *H10H 20/857* (2025.01)

(58) Field of Classification Search
CPC .... H10H 20/814; H10H 20/82; H10H 20/857; H01L 25/0753
See application file for complete search history.

(56) References Cited

U.S. PATENT DOCUMENTS

2017/0309793 A1* 10/2017 Seo .................. H10H 20/8516

FOREIGN PATENT DOCUMENTS

| CN | 103370748 A | 10/2013 |
| TW | 202044503 A | 12/2020 |

* cited by examiner

*Primary Examiner* — Samuel A Gebremariam
(74) *Attorney, Agent, or Firm* — Patterson + Sheridan, LLP

(57) ABSTRACT

A pixel package includes a carrier, a first light-emitting unit, a second light emitting unit, a reflective layer, and a light-absorbing layer. The carrier has a top surface and a conductive layer. The first light-emitting unit and the second light-emitting unit are arranged on the conductive layer and have a light-emitting surface and a side surface respectively. The reflective layer is arranged on the top surface and contacts the conductive layer. The light-absorbing layer is arranged on the reflective layer and contacts the first side surface and the second side surface while exposing the first light-emitting surface and the second light-emitting surface. In a cross-sectional view, the light-absorbing layer has a first thickness and a second thickness between the first side surface and the second side surface. The first thickness is farther away from and the first side surface than the second thickness, and is smaller than the second thickness.

20 Claims, 9 Drawing Sheets

PIXEL PACKAGE

CROSS REFERENCE TO RELATED APPLICATIONS

This application claims priority of Taiwan Patent Application No. 111115811, filed on Apr. 26, 2022, the entirety of which is incorporated by reference herein.

BACKGROUND

Technical Field

The present disclosure relates to a pixel package and a display module using the same, and, in particular, to a pixel package and a display module using a semiconductor light-emitting diode as a light-emitting unit.

Description of the Related Art

FIG. 1A discloses a display module 100 including a base 1 and a plurality of pixel packages 2 arranged in an array configuration on the base 1. Each pixel package 2 includes a carrier 20, a pixel 2P disposed on the carrier 20, and a light-transmitting layer 24 disposed on the carrier 20 and covering the pixel 2P. The pixel 2P includes a first light-emitting unit 21, a second light-emitting unit 22, and a third light-emitting unit 23, which can respectively emit red light, blue light, and green light. The pixel 2P can receive a control signal and emit red, blue, and green light independently for being a pixel in the display module 100. A distance between the first light-emitting units 21, the second light-emitting units 22, or the third light-emitting units 23 respectively in two adjacent pixels 2P is constant and determined by the size of the base 1 and the resolution of the display module 100. There is an aisle g1 between two adjacent pixel packages 2. The light from the sidewall of the pixel package 2 may pass through the light-transmitting layer 24 and the aisle g1 to the adjacent pixel package 2, therefore causing the optical crosstalk between the adjacent pixel packages 2 and reducing the display contrast of the display module 100.

FIG. 1B is a cross-sectional view of the pixel package 2 in the display module 100 mentioned above. As shown in FIG. 1B, the pixel package 2 includes a light-absorbing layer 25 between the carrier 20 and the light-transmitting layer 24. The carrier 20 includes an upper conductive layer 204, an insulating layer 202, and a lower conductive layer 206. The light-absorbing layer 25 covers the upper conductive layer 204 of the carrier 20, and fills up to be flush with the light-emitting surfaces 21S, 22S, 23S of the light-emitting units 21, 22, 23. The light-absorbing layer 25 includes a matrix and a black material, wherein the transmittance of the light-absorbing layer 25 can be controlled by adjusting the concentration of the black material in the matrix. Since the light-absorbing layer 25 covers the side surfaces 21W, 22W, 23W of the light-emitting units 21, 22, 23, the lights generated by the light-emitting units 21, 22, 23 only can be able to emit out from the light-emitting surfaces 21S, 22S, 23S, respectively. Most of the lights emitted from the side surfaces 21W, 22W, 23W could be absorbed by the light-absorbing layer 25. Although the optical crosstalk can be reduced by the above design, the luminous intensity and the light emitting angle of the light-emitting unit in the pixel package 2 could also be accordingly decreased.

SUMMARY

An embodiment of the present disclosure provides a pixel package including a carrier, a first light-emitting unit, a second light-emitting unit, a reflective layer, and a light-absorbing layer. The carrier has a top surface and an upper conductive layer formed on the top surface. The first light-emitting unit is arranged on the upper conductive layer and has a first light-emitting surface and a first side surface. The second light-emitting unit is arranged on the upper conductive layer and has a second light-emitting surface and a second side surface. The reflective layer is arranged on the top surface and connected to the conductive layer. The light-absorbing layer is arranged on the reflective layer and connected to the reflective layer, the first side surface, and the second side surface while exposing the first light-emitting surface and the second light-emitting surface. The first light-emitting unit and the second light-emitting unit are able to emit different colors. In a cross-sectional view, the first side surface has a first side portion facing the second light-emitting unit and the second side surface has a second side portion facing the first light-emitting unit. Along the vertical direction, the light-absorbing layer has a first thickness and a second thickness between the first side portion and the second side portion. The first thickness is located farther away from the first side portion than the second thickness, and is smaller than the second thickness.

Another embodiment of the present disclosure provides a pixel package including a carrier, a first light-emitting unit, a second light-emitting unit, a light-absorbing layer, and a light-transmitting layer. The carrier has a top surface and an upper conductive layer formed on the top surface. The first light-emitting unit is arranged on the upper conductive layer and has a first light-emitting surface and the first side surface. The second light-emitting unit is arranged on the upper conductive layer and has a second light-emitting surface and the second side surface. The light-absorbing layer is arranged on the top surface and connect to the upper conductive layer while exposing the first light-emitting surface and the second light-emitting surface. The light-transmitting layer is arranged on the light-absorbing layer, and connected to the light-absorbing layer, the first side surface, and the second side surface. The first light-emitting unit and the second light-emitting unit are able to emit different colors. In a cross-sectional view, the first side surface has a first side portion facing the second light-emitting unit and the second side surface has a second side portion facing the first light-emitting unit. Along the vertical direction, the light-transmitting layer has a first thickness and a second thickness between the first side portion and the second side portion. The first thickness is located farther away from the first side portion than the second thickness, and is smaller than the second thickness.

DETAILED DESCRIPTION

Figure 2A:
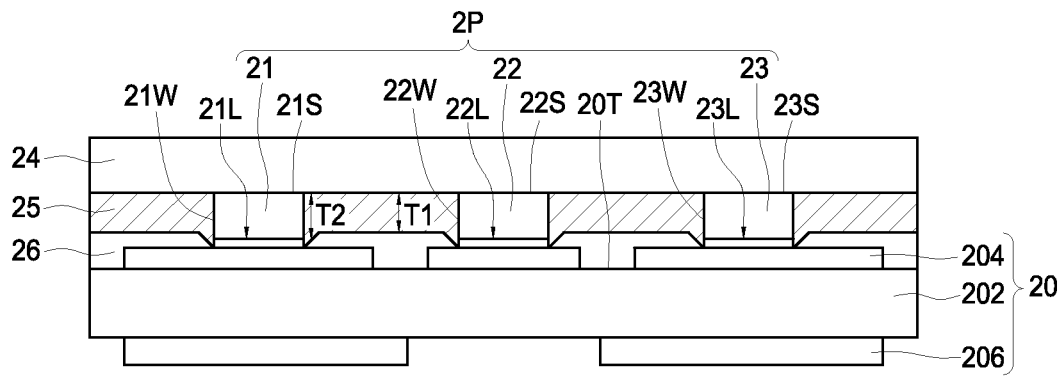
FIG. 2A is a cross-sectional schematic diagram of a pixel package in accordance with an embodiment of the present disclosure.
Figure 2B:
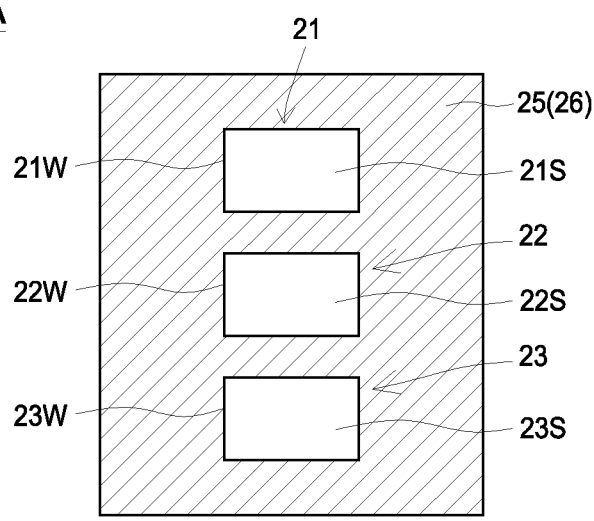
FIG. 2B is a top view of a pixel package in accordance with an embodiment of the present disclosure.

FIG. 2A and FIG. 2B show the structure of a pixel package 2A. FIG. 2A shows a cross-sectional schematic diagram of the pixel package 2A, and FIG. 2B shows a top view of the pixel package 2A. As shown in FIG. 2A, the pixel package 2A includes a carrier 20, a pixel 2P, a reflective layer 26, a light-absorbing layer 25, and a light-transmitting layer 24, wherein the pixel 2P includes a first light-emitting unit 21, a second light-emitting unit 22, and a third light-emitting unit 23. In one embodiment, the carrier 20 includes an insulating layer 202, an upper conductive layer 204, a plurality of conductive vias (not shown), and a lower conductive layer 206. The upper conductive layer 204 electrically connects to the pixel 2P, and electrically connects to the lower conductive layer 206 through the conductive vias. The lower conductive layer 206 can be electrically connected to an external control circuit to receive a power and/or a control signal.

As FIG. 2A shows, the insulating layer 202 of the carrier 20 includes a top surface 20T and the upper conductive layer 204 is arranged on the top surface 20T. The first light-emitting unit 21, the second light-emitting unit 22, and the third light-emitting unit 23 are arranged on the upper conductive layer 204. The first light-emitting unit 21 has a first light-emitting surface 21S and a first side surface 21W, the second light-emitting unit 22 has a second light-emitting surface 22S and a second side surface 22W, and the third light-emitting unit 23 has a third light-emitting surface 23S and a third side surface 23W. The reflective layer 26 is arranged above the top surface 20T and directly contacts the upper conductive layer 204, the first light-emitting unit 21, the second light-emitting unit 22, and the third light-emitting unit 23. A portion of the upper conductive layer 204 not covered by the light-emitting units 21, 22, 23 is covered by the reflected layer 26. In one embodiment, the uppermost surface of the reflective layer 26 has a portion higher than a light-emitting layer 21L, 22L, or 23L of the light-emitting units 21, 22, 23 but lower than the light-emitting surfaces 21S, 22S, 23S, wherein the light-emitting layer generates light in the light-emitting unit. The light-absorbing layer 25 is arranged above the reflective layer 26 and directly contacts the reflective layer 26, the first side surface 21W, the second side surface 22W, and the third side surface 23W, and fills up to be flush with the light-emitting units 21, 22, 23 to expose the light-emitting surfaces 21S, 22S, 23S. In another embodiment, the uppermost surface or the highest point of the light-absorbing layer 25 can be slightly lower than the light-emitting surfaces 21S, 22S, 23S of the light-emitting units 21, 22, 23.

In one embodiment, the first light-emitting unit 21, the second light-emitting unit 22, and the third light-emitting unit 23 are light-emitting diode dies (LED die) that can respectively emit light with different wavelengths or different colors. In one embodiment, the first light-emitting unit 21 is a red light-emitting diode, which can emit the first light with a dominant wavelength or peak wavelength between 600 nm and 660 nm. The second light-emitting unit 22 is a green light-emitting diode die, which can emit a second light with a dominant wavelength or peak wavelength between 510 nm and 560 nm. The third light-emitting unit 23 is a blue light-emitting diode die, which can emit a third light with a dominant wavelength or peak wavelength between 430 nm and 480 nm. All the first light-emitting unit 21, the second light-emitting unit 22, and the third light-emitting unit 23 comprise a p-type semiconductor layer, a n-type semiconductor layer, and a light-emitting layer 21L, 22L, or 23L, but the compositions of above structures are different from each other. For example, the p-type semiconductor layer, the n-type semiconductor, and the light-emitting layer may include III-V group semiconductor compound material, such as AlInGaAs base, AlInGaP base, InGaAsP base, or AlInGaN base materials. AlInGaAs base can be expressed as $(Al_{x1}In_{(1-x1)})_{1-x2}Ga_{x2}As$, AlInGaP base can be expressed as $(Al_{x1}In_{(1-x1)})_{1-x2}Ga_{x2}P$, InGaAsP base can be expressed as $In_{x1}Ga_{1-x1}As_{x2}P_{1-x2}$, and AlInGaN base can be expressed as $(Al_{x1}In_{(1-x1)})_{1-x2}Ga_{x2}N$, wherein $0 \leq x1 \leq 1$ and $0 \leq x \leq 1$. The wavelength of the light emitted by the light-emitting unit depends on the material of the light-emitting layer thereof. For example, the material of the light-emitting layer includes AlInGaAs base, AlInGaP base, InGaAsP base, or AlInGaN base materials. The light-emitting unit can emit an infrared light with a peak wavelength between 700 nm and 1700 nm, a red light with a peak wavelength between 610 nm and 700 nm, a green light with a peak wavelength between 530 nm and 570 nm, a cyan light with a peak wavelength between 490 nm and 550 nm, a blue light or a dark blue light with a peak wavelength between 400 nm and 490 nm, or an ultraviolet light with a peak wavelength between 250 nm and 400 nm. An ultraviolet light with a peak wavelength between 250 nm and 400 nm can be emitted when the material of the light-emitting layer includes InGaN base or AlGaN base materials. A red light with a peak wavelength between 610 nm and 650 nm or a green light with a peak wavelength between 530 nm and 570 nm can be emitted when the material of the light-emitting layer includes AlInGaP base material. A blue light with a peak wavelength between 400 nm and 490 nm, a cyan light with a peak wavelength between 490 nm and 530 nm, or a green light with a peak wavelength between 530 nm and 570 nm can be emitted when the material of the light-emitting layer includes InGaN base material. An ultraviolet light with a peak wavelength between 250 nm and 400 nm can be emitted when the material of the light-emitting layer includes AlGaN base or AlInGaN base material.

In another embodiment, the first light-emitting unit 21 includes a LED die and a wavelength conversion material covering the LED die, wherein the LED die emits a light with a wavelength shorter than that of a red light, for example, a blue LED or an ultraviolet LED. The wavelength conversion material, a phosphor for example, can convert the blue light or ultraviolet light into a red light. The second light-emitting unit 22 includes a LED die with a wavelength shorter than that of the green light, for example, a blue LED or an ultraviolet LED, and is covered by a wavelength conversion material which can convert the blue light or ultraviolet light into a green light. The third light-emitting unit 23 includes a blue LED die or an ultraviolet LED die. When the third light-emitting unit 23 includes the ultraviolet LED die, the third light-emitting unit 23 also includes a wavelength conversion material which covers the ultraviolet LED and can convert the ultraviolet light into a blue light. In another embodiment, when the third light-emitting unit 23 includes a blue LED die, the blue LED die can be covered by a transparent material or is uncovered. The person having ordinary skill in the art should know that the pixel 2P can be composed of the above various light-emitting units, and is not limited to the above-mentioned embodiments.

In one embodiment, the light-absorbing layer 25 and the reflective layer 26 can be formed by a B-stage (semi-cured) film, wherein a matrix of the B-stage film includes silicone, epoxy, polyurethane (PU), thermoplastic urethane (TPU), or combination thereof. When the B-stage film is used as the light-absorbing layer 25, the B-stage film can include a black material, such as carbon black. The transmittance of the light-absorbing layer 25 can be greater than 0% but less than 30%, or the lightness L* in L*a*b* color space can be greater than 0 but less than 30, by controlling the concentration ratio of the black material to the matrix. In other words, the color of the light-absorbing layer is not completely black. When the B-stage film is used as the reflective layer 26, the B-stage film may have white color, gray color, yellow color, silver color and so on. The film can include a matrix and a reflective material, wherein the material of the matrix can be silicone, epoxy, polyurethane (PU), thermoplastic urethane (TPU), or combination thereof, and the reflective material can include titanium oxide ($TiO_x$), silicon oxide ($SiO_x$), or a combination thereof.

The light-transmitting layer 24 covers the light-emitting surfaces 21S, 22S, 23S and the uppermost surface of the light-absorbing layer 25 to isolate the light-emitting surfaces 21S, 22S, 23S from external environment. The material of the light-transmitting layer 24 can include silicon, epoxy, acrylic, or a combination thereof. In one embodiment, the transmittance of the light-transmitting layer 24 is greater than 90%. In another embodiment, the light-transmitting layer 24 can be doped with a black material, such as carbon black, to reduce the transmittance of the light-transmitting layer 24 to between 30% and 70% and decrease external light reflected by the pixel package when the light-emitting unit is not emitting light. In another embodiment, the light-transmitting layer 24 can be doped with diffusion particles to increase the light emitting angle of the pixel package 2A. In another embodiment, the outer surface of the light-transmitting layer 24 can be roughened to reduce glare formed on the surface of the pixel package 2A.

Next, as shown in FIG. 2B, the reflective layer 26 completely covers the upper conductive layer 204 of the carrier 20 in the top view of the pixel package 2A, and exposes the light-emitting surfaces 21S, 22S, 23S of the light-emitting units 21, 22, 23. Besides, because the light-absorbing layer 25 covers the side surfaces 21W, 22W, 23W of the light-emitting units 21, 22, 23, the lights emitted from the side surfaces 21W, 22W, 23W of the light-emitting units 21, 22, 23 of the pixel package 2A are blocked by the light-absorbing layer 25. Therefore, the optical crosstalk among the light-emitting units 21, 22, 23 can be avoided. With the structure shown in FIG. 4A, part of external light can be blocked by the light-absorbing layer 25, and another part of external light passing through the light-absorbing layer 25 is reflected upward by the reflective layer 26. Therefore, external light can be prevented from being reflected by the upper conductive layer 204 of the carrier 20, and the color purity and display contrast of the pixel package 2A can be improved. The hardness of the light-absorbing layer 25 and the hardness of the reflective layer 26 can be less than the hardness of the light-transmitting layer 24. For example, according to the measurement of shore D method, the Shore hardness of the light-absorbing layer 25 and the Shore hardness of the reflective layer 26 are less than 60, but the Shore hardness of the light-transmitting layer 24 is greater than 60. In another embodiment, the light-transmitting layer 24 has a Shore hardness greater than 60 to resist scratch.

In one embodiment, the thickness of the reflective layer 26 is not uniform. As shown in the cross-sectional view of FIG. 2A, the first side surface 21W has a first side portion facing the second light-emitting unit 22, and the second side surface 22W has a second side portion facing the first light-emitting unit 21. The reflective layer 26 has different thicknesses at horizontal positions (measured in the vertical direction) between the first side portion and the second side portion. The bottom surface of the light-absorbing layer 25 and the top surface of the reflective layer 26 are conformal. That is to say, when the top surface of the light-absorbing layer 25 is flat viewed in macroscope, the light-absorbing layer 25 has different thicknesses at horizontal positions. The light-absorbing layer 25 has two first portions adjacent to the first side portion of the first side surface 21W or adjacent to the second side portion of the second side surface 22W, and also has a second portion between the two first portions. The thickness of the first portion gradually becomes thicker from the second portion to the first side portion or to the second side portion, and the thickness of the second portion is substantially constant and thinner than that of the first portions. That is to say, in the cross-sectional view, the reflective layer 26 has a trapezoidal appearance, and the light-absorbing layer 25 has an inverted U shape appearance, wherein the width of the light-absorbing layer 25 gradually narrows toward both end of the U shape. In the cross-sectional view, the light-absorbing layer 25 between the first side portion of the first side surface 21W and the second side portion of the second side surface 22W has a first thickness T1 and a second thickness T2. The first thickness T1 is located farther away from the first side portion of the first side surface 21W or the second side portion of the second side surface 22W than the second thickness T2, and the first thickness T1 is smaller than the second thickness T2.

As shown in FIG. 2A, the thickness of the reflective layer 26 gradually becomes thinner near the side surfaces 21W, 22W, or 23W to form an inclined surface. Besides, because the light-absorbing layer 25 is not completely black, part of the lights emitted from the side surfaces 21W, 22W, 23W can pass through the light-absorbing layer 25 and then be reflected upward or reflected back to the inside of the light-emitting units 21, 22, 23 by an inclined surface of the reflective layer 26. In other words, part of the lights emitted from the side surface of the light-emitting units can be reflected upward by the inclined surface of the reflective layer 26 and then emitting out of the light-transmitting layer 24. Therefore, the overall luminous intensity of the pixel package 2A can be improved, and the light emitting angle of the pixel package 2A can also be increased. The light emitting angle can also be controlled by adjusting the angle between the inclined surface of the reflective layer 26 and the side surfaces 21W, 22W, or 23W.

Figure 3A:
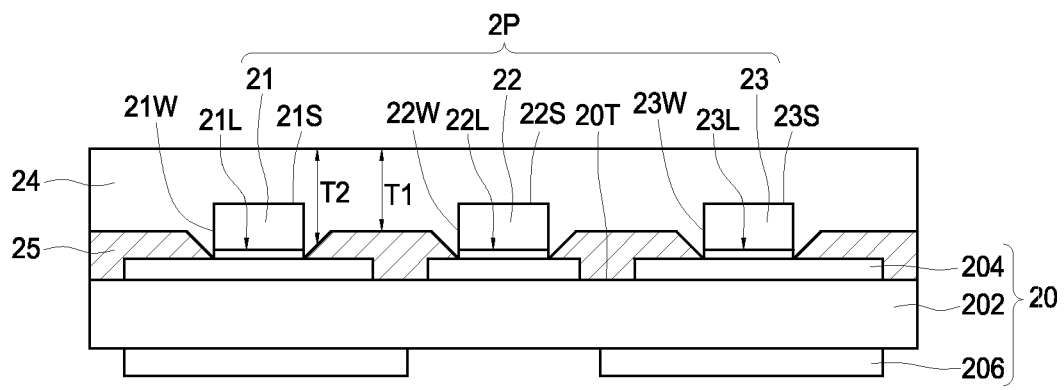
FIG. 3A is a cross-sectional schematic diagram of a pixel package in accordance with another embodiment of the present disclosure.
Figure 3B:
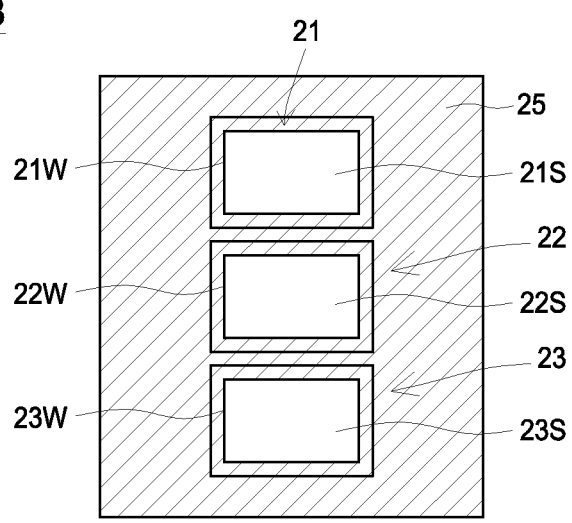
FIG. 3B is a top view of a pixel package in accordance with another embodiment of the present disclosure.

FIGS. 3A and 3B show the structure of another pixel package 2B. FIG. 3A shows a cross-sectional view of the pixel package 2B, and FIG. 3B shows a top view of the pixel package 2B. For the detailed description of the pixel package 2B, please refer to the schematic diagram of the aforementioned pixel package 2A and related descriptions. In the pixel package 2B, the uppermost surface or the highest point of the light-absorbing layer 25 is lower than the light-emitting surfaces 21S, 22S, 23S of the light-emitting units 21, 22, 23. Besides, because the pixel package 2B does not have the reflective layer 26 as shown in FIG. 2A, the light-absorbing layer 25 is disposed above the top surface 20T and directly contacts the upper conductive layer 204, the first light-emitting unit 21, the second light-emitting unit 22, and the third light-emitting unit 23 while exposing the light-emitting surfaces 21S, 22S, 23S and a portion of the side surfaces 21W, 22W, 23W. Wherein, the light-transmitting layer 24 is disposed above the light-absorbing layer 25 and directly contacts the light-absorbing layer 25 and the side surfaces 21W, 22W, 23W. The lights emitted from the side surfaces 21W, 22W, 23W of the light-emitting units 21, 22, 23 can enter the light-transmitting layer 24 before entering the light-absorbing layer 25. Compared with the pixel package 2A, the amount of the lights generated by the light-emitting units 21, 22, 23 in the pixel package 2B emitting out of the pixel package from the side surfaces 21W, 22W, 23W is larger. Hence, the luminous efficiency of the pixel package 2B is better than that of the pixel package 2A. Besides, the light-absorbing layer 25 can prevent the optical crosstalk among the light-emitting units 21, 22, 23, and can also prevent external light passing through the light-transmitting layer 24 from emitting to the upper conductive layer 204 of the carrier 20 and being reflected upward. Therefore, the color purity and display contrast of the pixel package 2B are improved.

In one embodiment, the thickness of the light-absorbing layer 25 is not uniform. In the cross-sectional view of FIG. 3A, the first side surface 21W has a first side portion facing the second light-emitting unit 22 and the second side surface 22W has a second side portion facing the first light-emitting unit 21. The light-absorbing layer 25 between the first side portion of the first side surface 21W and the second side portion of the second side surface 22W has different thicknesses at horizontal positions (measured in the vertical direction). The light-transmitting layer 24 also has different thickness corresponding to the shape of the light-absorbing layer 25. The light-absorbing layer 24 has two third portions adjacent to the first side portion of the first side surface 21W or adjacent to the second side portion of the second side surface 22W, and also has a fourth portion between the two third portions. The thickness of the third portion gradually becomes thicker from the fourth portion to the first side portion or to the second side portion, and the thickness of the fourth portion is substantially constant and thinner than that of the third portions. That is to say, the light-absorbing layer 25 has a trapezoidal appearance in the cross-sectional view, and the light-transmitting layer 24 has an inverted U shape appearance with a flat top surface. The bottom surface of the inverted U shape appearance corresponds to the shape of the light-absorbing layer 25, wherein the width of the light-transmitting layer 24 gradually narrows toward both end of the U shape. In the cross-sectional view, the light-transmitting layer 24 between the first side portion of the first side surface 21W and the second side portion of the second side surface 22W has a first thickness T1 and a second thickness T2. The first thickness T1 is located farther away from the first side portion of the first side surface 21W or the second side portion of the second side surface 22W than the second thickness T2, and the first thickness T1 is smaller than the second thickness T2.

In one embodiment, the light-absorbing layer 25 is formed by a B-stage film, and the film can include a matrix and a black material. The matrix includes silicone, epoxy, polyurethane (PU), thermoplastic urethane (TPU), or combination thereof, and the black material includes carbon black. The transmittance of the light-absorbing layer 25 can be greater than 0% but less than 30%, or the lightness L* in L*a*b* color space can be greater than 0 but less than 30, by controlling the concentration ratio of the black material to the matrix. In other words, the light-absorbing layer 25 is not completely black. The light-transmitting layer 24 covers the light-emitting surfaces 21S, 22S, 23S, portions of the side surfaces 21W, 22W, 23W, and the top surface of the light-absorbing layer 25 to isolate the light-emitting units 21, 22, 23 from external environment. Wherein, the material of the light-transmitting layer 24 includes silicon, epoxy, acrylic, or a combination thereof. In one embodiment, the transmittance of the light-transmitting layer 24 is greater than 90%. In another embodiment, the light-transmitting layer 24 can be doped with a black material, such as carbon black, to reduce the transmittance of the light-transmitting layer 24 to between 30% and 70% and decrease external light reflected by the pixel package when the light-emitting unit is not emitting light. In another embodiment, the light-transmitting layer 24 can be doped with diffusion particles to increase the light emitting angle of the pixel package 2A. In another embodiment, the outer surface of the light-transmitting layer 24 can be roughened to reduce glare formed on the surface of the pixel package 2A.

Besides, the lights can emit out from the side surfaces 21W, 22W, 23W because the gaps between the light-absorbing layer 25 and the side surfaces 21W, 22W, 23W have been filled by the light-transmitting layer 24. The light-absorbing layer 25 near the side surfaces 21W, 22W, or 23W forms an inclined surface, wherein the inclined surface is closer to the light-transmitting layer 24 than the carrier 20 when the inclined surface farther from the side surfaces 21W, 22W, or 23W. Part of the lights emitted from the side surfaces and passing through the inclined surface of the non-completely black light-absorbing layer 25 still can be reflected upward to the light-transmitting layer 24 and emit to the outside. Thus, the overall luminous intensity of the pixel package 2A can be improved, and the light emitting angle of the pixel package 2A is increased. The light emitting angle can also be controlled by adjusting the angle of the inclined surface of the light-absorbing layer 25.

Figure 4A:
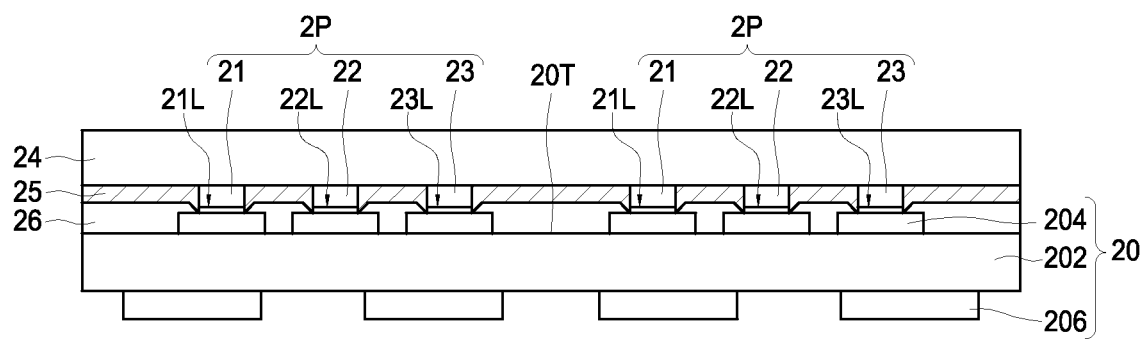
FIG. 4A is a cross-sectional schematic diagram of a multi-pixel package in accordance with an embodiment of the present disclosure.
Figure 4B:
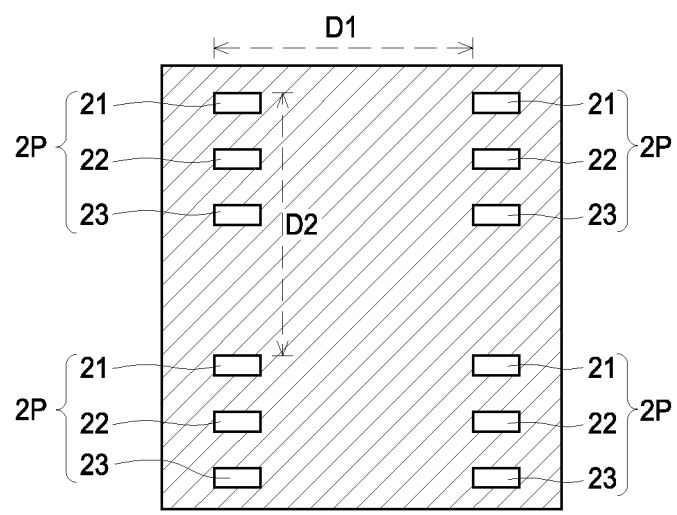
FIG. 4B is a top view of a multi-pixel package in accordance with an embodiment of the present disclosure.

FIG. 4A shows a cross-sectional view of a multi-pixel package 2C, and FIG. 4B shows a top view of the multi-pixel package 2C. The multi-pixel package 2C includes a plurality of pixels 2P shown in FIG. 2A, and the detail description of the multi-pixel package 2C can be referred to the above related descriptions and the schematic diagrams. In one embodiment, the multi-pixel package 2C includes 4 pixels. In the adjacent pixels 2P of the multi-pixel package 2C, the distance between the first light-emitting units 21 which emitting light with same wavelength, the distance between the second light-emitting units 22 which emitting light with same wavelength, and the distance between the third light-emitting units 23 which emitting light with same wavelength, are the same. As shown in FIG. 4B, along the horizontal direction, the distance between the first light-emitting units 21 of adjacent pixels 2P is D1. Along the vertical direction, the distance between the first light-emitting units 21 of adjacent pixels 2P is D2 which is the same as D1.

Figure 5A:
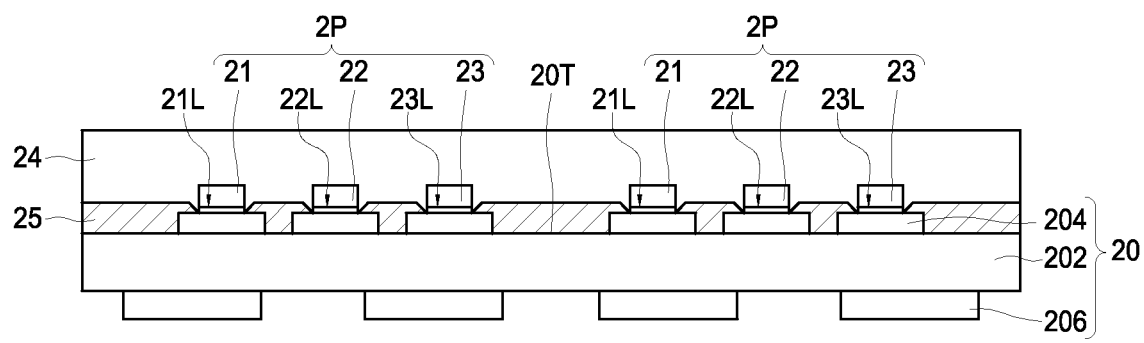
FIG. 5A is a cross-sectional schematic diagram of a multi-pixel package in accordance with another embodiment of the present disclosure.
Figure 5B:
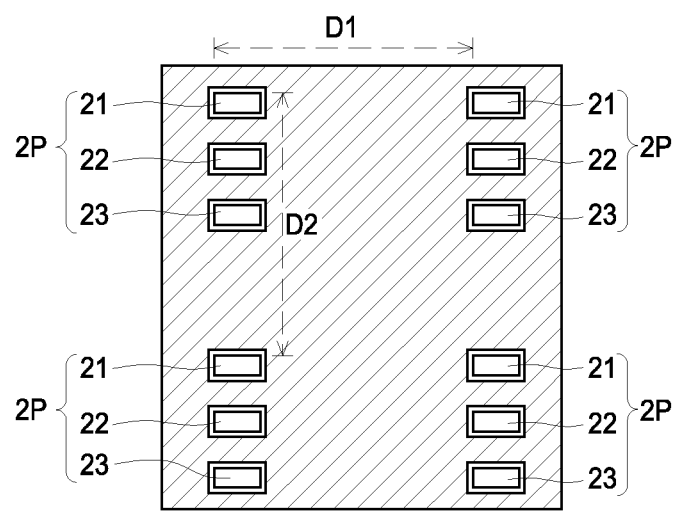
FIG. 5B is a top view of a multi-pixel package in accordance with another embodiment of the present disclosure.

Referring to FIG. 5A and FIG. 5B, FIG. 5A shows a cross-sectional view of a multi-pixel package 2D and FIG. 5B shows a top view of the multi-pixel package 2D. In another embodiment, the multi-pixel package 2D includes a plurality of pixels 2P of the pixel package 2B as shown in FIG. 3A, and the detail description of the multi-pixel package 2D can be referred to the above related descriptions and the schematic diagrams. In this embodiment, the multi-pixel package 2D includes 4 pixels. In the multi-pixel package 2D, the distances between the first light-emitting units 21, between the second light-emitting units 22, or between the third light-emitting units 23 of adjacent pixels 2P are the same, wherein the first light-emitting units 21 in adjacent pixels 2P emit light with same wavelength, the second light-emitting units 22 in adjacent pixels 2P emit light with same wavelength, and the third light-emitting units 23 in adjacent pixels 2P emit light with same wavelength. As shown in FIG. 5B, along the horizontal direction, the distance between the first light-emitting units 21 of adjacent pixels 2P is D1. Along the vertical direction, the distance between the first light-emitting units 21 of adjacent pixels 2P is D2, which is the same as D1. Besides, the uppermost surface or the highest point of the light-absorbing layer 25 is below than the light-emitting surfaces 21S, 22S, 23S of the light-emitting units 21, 22, 23 to expose a portion of the side surface 21W, 22W, 23W of the light-emitting units 21, 22, 23.

Figure 1A:
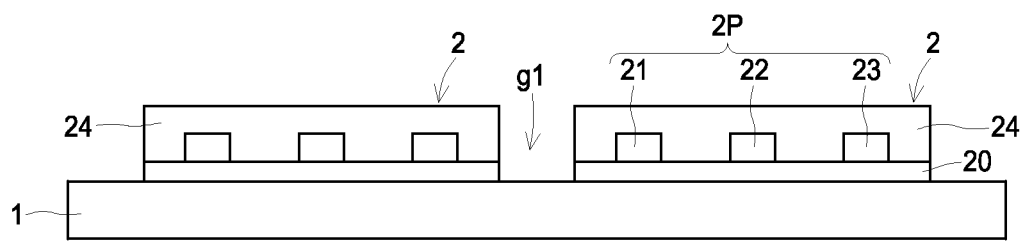
FIG. 1A is a cross-sectional schematic diagram of a conventional display module.
Figure 1B:
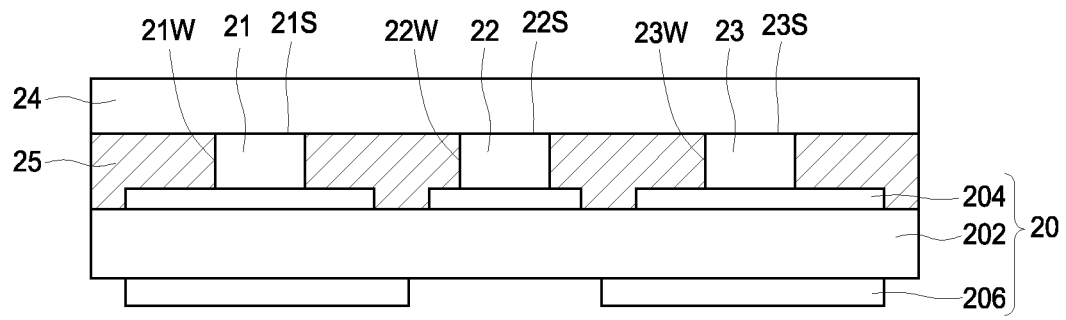
FIG. 1B is a cross-sectional schematic diagram of a conventional pixel package.

Each pixel package 2A, 2B or each multi-pixel package 2C, 2D in aforementioned embodiments can be used alone or in combination to replace the pixel package 2 of the display module 100 in FIG. 1A to form a display module (not shown). When the display module includes the pixel package described in any above embodiment, the overall luminous intensity and display contrast of the display module can be improved, and the light emitting angle of each pixel package can be easily adjusted and controlled.

Figure 6A:
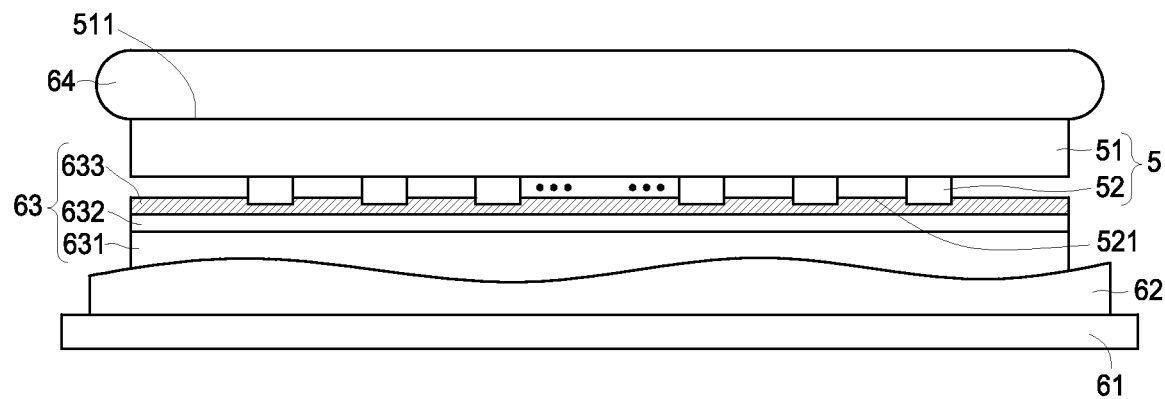
FIG. 6A to FIG. 6I show encapsulating processes in accordance with two embodiments of the present disclosure.

FIG. 6A to FIG. 6E disclose an encapsulating process in accordance with an embodiment of the present disclosure. As shown in FIG. 6A, a supporting base 61, such as a steel plate, is provided and a soft plate 62 are placed on the supporting base 61. A film 63 is placed on the soft plate 62, wherein the film 63 includes a carrier film 631, an adhesive film 633, and a release layer 632 between the carrier film 631 and the adhesive film 633. The adhesive film 633 can be a B-stage film, and includes a matrix including silicone, epoxy, polyurethane (PU), thermoplastic urethane (TPU), or combination thereof. The adhesive film 633 includes a transparent adhesive film or a colored adhesive film. The transparent adhesive film can be used to form the light-transmitting layer 24 in each pixel package as mentioned above; the colored adhesive film can be used to form the light-absorbing layer 25 and/or the reflective layer 26 as mentioned above. When the adhesive film 633 is the colored adhesive film and includes a black material, such as carbon black, the transmittance of the adhesive film 633 can be greater than 0% but less than 30%, or the lightness L* in L*a*b* color space of the light-absorbing layer 25 can be greater than 0 but less than 30, which means the adhesive film 633 is not completely black, by controlling the concentration ratio of the black material to silicone, epoxy, polyurethane (PU), thermoplastic urethane (TPU), or combination thereof. When the adhesive film 633 is formed with the material of the reflective layer 26 and includes reflective materials, such as titanium oxide (TiOx), silicon oxide (SiOx), or a combination thereof, the adhesive film 633 may have white color, gray color, yellow color, silver color and so on.

Figure 6B:
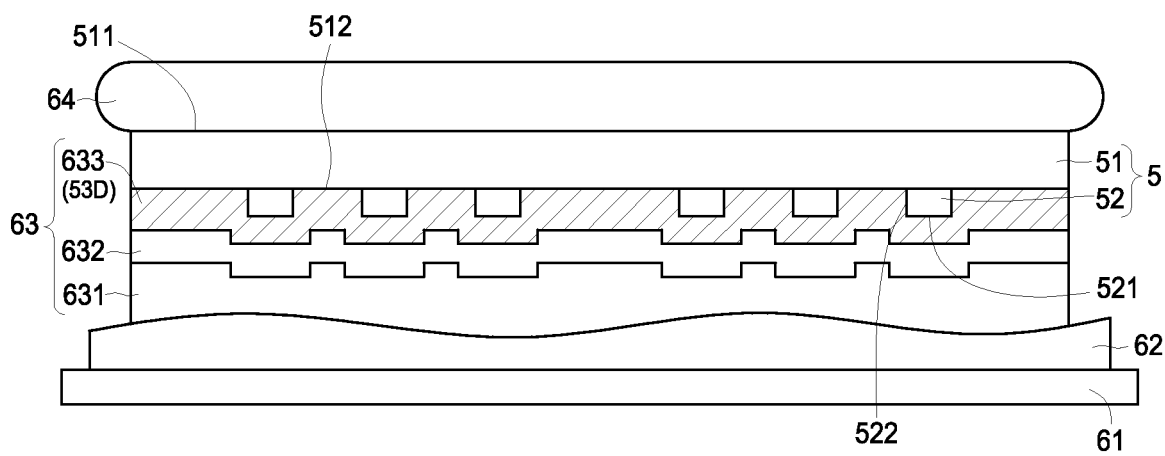

Next, a device 5 including a base 51 and a plurality of light-emitting elements 52 arranged on the base 51 is provided. As shown in FIG. 6B, the device 5 is placed upside down on the film 63, so that the top surface 521 of each light-emitting element 52 contacts the adhesive film 633 of the film 63. An air pressure pad 64 is provided for giving a pressure on the base 51 by pressing a back side 511 of the base 51 relatively to the light-emitting elements 52 (a side devoid of the light-emitting elements 52). Then, the light-emitting elements 52 are partially embedded into the film 63. During the manufacturing process, the adhesive film 633 is heated to be maintained in a softened state. The device 5 can be the aforementioned pixel package 2A, 2B, 2C, or 2D. The base 51 can be the aforementioned carrier 20 (the upper conductive layer 204, the insulating layer 202, the lower conductive layer 206, and other structures are omitted in the figure). The light-emitting elements 52 can include the light-emitting units 21, 22, 23 mentioned above.

Figure 6C:
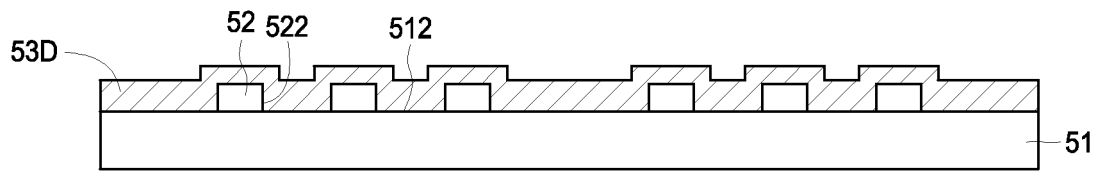

As FIG. 6B shows, the softened adhesive film 633 is pressed into the space between two adjacent light-emitting elements 52 by the air pressure pad 64 and the soft plate 62. After the adhesive film 633 fills the space between two adjacent light-emitting elements 52 with a predetermined thickness, stop the heating process to wait for a while to cure the adhesive film 633. After the adhesive film 633 is cured to form a solid adhesive layer 53D, the pressure of the air pressure pad 64 is released, and the release layer 632 and the carrier film 631 are removed to form a device 5D as shown in FIG. 6C. In one embodiment, the manufacturing process for forming the solid adhesive layer 53D can be used to form the reflective layer 26 of the pixel packages 2A, 2C or the light-absorbing layer 25 of the pixel packages 2B, 2D, to shield a portion of the top surface 512 which is uncovered by the light-emitting element 52 and to shield a portion or entire side surface 522 of the light-emitting element 52.

Figure 6D:
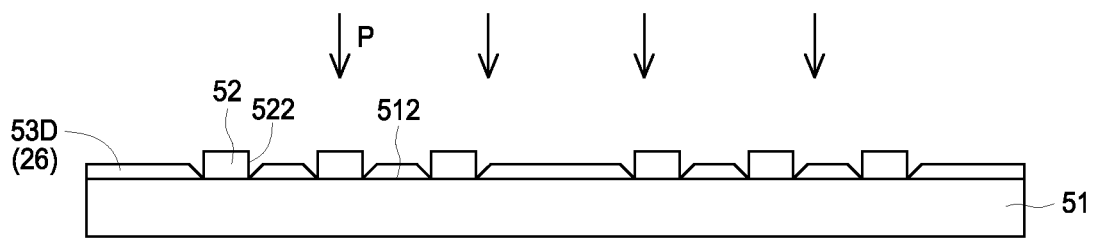

As shown in FIG. 6D, to form the aforementioned pixel package 2A or multi-pixel package 2C, the solid adhesive layer 53D includes reflective material. To uncover the light-emitting surface and/or portion of the side surface 522 of the light-emitting element 52 (corresponding to the light-emitting surface and/or portion of the side surface of the light-emitting units 21, 22, 23 mentioned above), the entire top surface of the solid adhesive layer 53D can be treated by a plasma etching process P for reducing the thickness of the solid adhesive layer 53D. In the plasma etching process P, a predetermined gas is continuously injected into a low-pressure and high-intensity electric field environment, so that the gas can be excited and dissociated into electrons, ions, and free radical particles. The molecular bonds in the solid adhesive layer 53D are broken by the free radical particles to form a gas with lower-molecules, and then the lower-molecules gas is extracted from the environment. Since the interface between the light-emitting element 52 and the solid adhesive layer 53D is heterojunction and their bonding strength is related weak, the solid adhesive layer 53D near the side surface 522 is more susceptible to be bombarded by the free radical particles. That is to say, the etching rate of the solid adhesive layer 53D is higher when it closer to the side surface 522. Therefore, an intermediate structure 5D1 is formed as shown in FIG. 6D, which can be an intermediate structure of the aforementioned pixel package 2A or an intermediate structure of the aforementioned multi-pixel package 2C. In one embodiment, the reflective layer 26 is formed by the solid adhesive layer 53D.

Figure 6E:
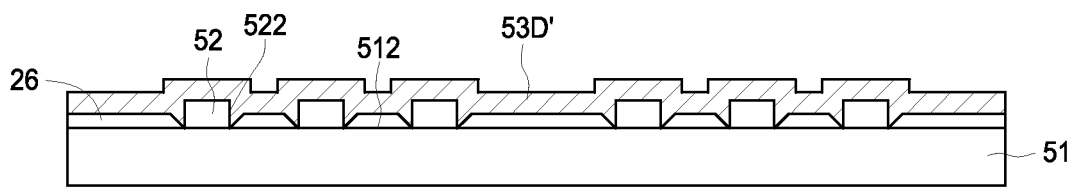
Figure 6F:
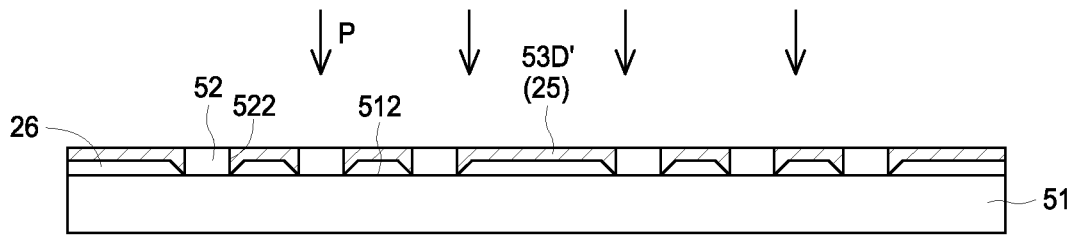
Figure 6G:
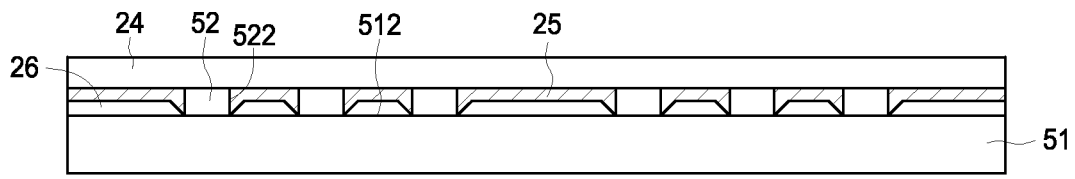

As shown in FIG. 6E, with the same manufacturing process steps shown in FIG. 6A to FIG. 6C, a light-absorbing solid adhesive layer 53D' similar to the light-absorbing layer 25 mentioned above is arranged on the reflective layer 26 to form an intermediate structure 5D2. Next, as shown in FIG. 6F, removing the excess solid adhesive layer 53D' to expose the light-emitting surface of the light-emitting element 52 (corresponding to the light-emitting surfaces 21S, 22S, 23S of the light-emitting units 21, 22, 23 mentioned above) by the aforementioned plasma etching process P. The remaining solid adhesive layer 53D' is flush with or slightly lower than the light-emitting surface of the light-emitting element 52 (corresponding to the light-emitting surfaces 21S, 22S, 23S of the light-emitting units 21, 22, 23 mentioned above) to form an intermediate structure 5D3, wherein the remaining solid adhesive layer 53D' is similar to the light-absorbing layer 25. Finally, as shown in FIG. 6G, a device 5D' is formed by forming the light-transmitting layer 24 on the light-absorbing layer 25 through laminating, molding, injection forming or other sealing processes. The aforementioned process can be equivalent to the process for forming the aforementioned pixel package 2A or the multi-pixel package 2C, while the detailed structures in the base 51, such as the upper conductive layer 204, the insulating layer 202, and the lower conductive layer 206, are omitted in the figure for brevity purpose.

Figure 6H:
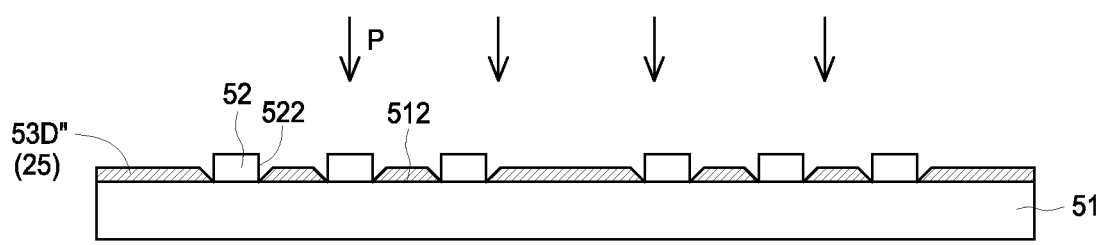
Figure 6I:
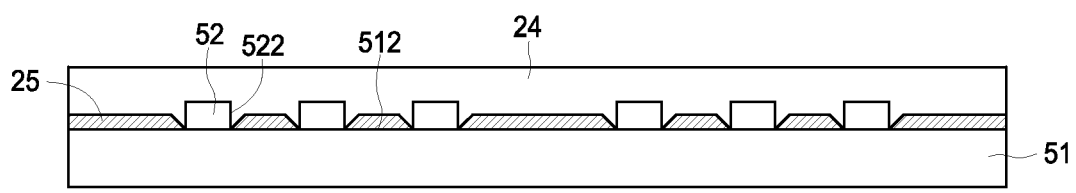

In another embodiment, to form the aforementioned pixel package 2B or the multi-pixel package 2D, the solid adhesive layer 53D in FIG. 6C includes the material of the light-absorbing layer 25. As FIG. 6H shows, after completing the structure of FIG. 6C, the solid adhesive layer 53D" including the material of the light-absorbing layer 25 is treated by the plasma etching process P to reduce the entire thickness of the solid adhesive layer 53D" for exposing the light-emitting surface and/or portion of the side surface 522 of the 52 (corresponding to the light-emitting surfaces 21S, 22S, 23S and/or portion of the side surfaces 21W, 22W, 23W of the light-emitting units 21, 22, 23 mentioned above). Similarly, the interface between the light-emitting element 52 and the solid adhesive layer 53D" is heterojunction which has weaker bonding strength, so that the solid adhesive layer 53D" near the side surface 522 is more susceptible to be bombarded by the free radical particles. That is to say, the etching rate of the solid adhesive layer 53D" is higher when it closer to the side surface 522. Therefore, an intermediate structure 5D4 is formed. In one embodiment, the light-absorbing layer 25 is formed by the solid adhesive layer 53D". After that, as shown in FIG. 6I, a device 5D" is formed by forming the light-transmitting layer 24 on the light-absorbing layer 25 through laminating, molding, injection forming or other sealing processes. The aforementioned process forms the structure of the aforementioned pixel package 2B or the multi-pixel package 2D, wherein the detailed structures in the base 51, such as the upper conductive layer 204, the insulating layer 202, and the lower conductive layer 206, are omitted in the figure for brevity purpose.

It will be apparent to those having ordinary skill in the art that various modifications and variations can be made to the devices in accordance with the present disclosure without departing from the scope or spirit of the disclosure. The same or similar parts in different embodiments, or parts marked with the same symbols in different embodiments have the same physical or chemical properties. In addition, the above-mentioned embodiments of the present application may be combined and replaced with each other under appropriate circumstances, and are not limited to the above-mentioned specific embodiments. The connection relationship between specific components and other components described in one embodiment can also be applied to other embodiments, and all fall within the scope of this application.

What is claimed is:

1. A pixel package, comprising:
    a carrier, having a top surface and an upper conductive layer formed on the top surface;
    a first light-emitting unit, arranged on the upper conductive layer and having a first light-emitting surface and a first side surface;
    a second light-emitting unit, arranged on the upper conductive layer and having a second light-emitting surface and a second side surface;
    a reflective layer, arranged on the top surface and connected to the conductive layer; and
    a light-absorbing layer, arranged on the reflective layer and connected to the reflective layer, the first side surface, and the second side surface while exposing the first light-emitting surface and the second light-emitting surface;
    wherein the first light-emitting unit and the second light-emitting unit are able to emit different colors;
    wherein, in a cross-sectional view, the first side surface has a first side portion facing the second light-emitting unit and the second side surface has a second side portion facing the first light-emitting unit, the light-absorbing layer has a first thickness and a second thickness between the first side portion and the second side portion, the first thickness is located farther away from the first side portion than the second thickness, and the first thickness is smaller than the second thickness.

2. The pixel package according to claim 1, wherein a lightness $L^*$ in $L^*a^*b^*$ color space of the light-absorbing layer is less than 30.

3. The pixel package according to claim 1, further comprising a third light-emitting unit arranged on the conductive layer, wherein the first light-emitting unit, the second light-emitting unit, and the third light-emitting unit are able to emit different colors.

4. The pixel package according to claim 1, wherein a portion of the conductor layer uncovered by the first light-emitting unit and the second light-emitting unit is covered by the reflective layer.

5. The pixel package according to claim 1, wherein the light-absorbing layer has a highest point, and the highest point is lower than the first light-emitting surface and the second light-emitting surface.

6. The pixel package according to claim 1, wherein the first light-emitting unit comprises a light-emitting layer, and the reflective layer has a portion higher than the light-emitting layer.

7. The pixel package according to claim 1, further comprising a light-transmitting layer covering the first light-emitting surface and the second light-emitting surface.

8. The pixel package according to claim 1, wherein the reflective layer has a trapezoidal appearance in the cross-sectional view.

9. The pixel package according to claim 1, wherein the light-transmitting layer has a rough outer surface.

10. The pixel package according to claim 1, wherein the carrier further comprises an insulating layer and a lower conductive layer, the insulating layer has the top surface, and the lower conductive layer is arranged under the insulating layer.

11. A pixel package, comprising:
    a carrier, having a top surface and an upper conductive layer formed on the top surface;
    a first light-emitting unit, arranged on the upper conductive layer and having a first light-emitting surface and a first side surface;
    a second light-emitting unit, arranged on the upper conductive layer and having a second light-emitting surface and a second side surface;

a light-absorbing layer, arranged on the top surface and connected to the upper conductive layer while exposing the first light-emitting surface and the second light-emitting surface; and a light-transmitting layer, arranged on the light-absorbing layer and connected to the light-absorbing layer, the first side surface, and the second side surface;

wherein the first light-emitting unit and the second light-emitting unit are able to emit different colors;

wherein, in a cross-sectional view, the first side surface has a first side portion facing the second light-emitting unit and the second side surface has a second side portion facing the first light-emitting unit, the light-transmitting layer has a first thickness and a second thickness between the first side portion and the second side portion, the first thickness is located farther away from the first side portion than the second thickness, and the first thickness is smaller than the second thickness.

12. The pixel package according to claim 11, wherein a lightness $L^*$ in $L^*a^*b^*$ color space of the light-absorbing layer is less than 30.

13. The pixel package according to claim 11, further comprising a third light-emitting unit arranged on the conductive layer, wherein the first light-emitting unit, the second light-emitting unit, and the third light-emitting unit are able to emit different colors.

14. The pixel package according to claim 11, wherein the light-absorbing layer has a highest point, and the highest point is lower than the first light-emitting surface and the second light-emitting surface.

15. The pixel package according to claim 14, wherein the first light-emitting unit comprises a light-emitting layer, and the light-emitting layer is lower than the highest point.

16. The pixel package according to claim 11, wherein the light-transmitting layer covers the first light-emitting surface and the second light-emitting surface.

17. The pixel package according to claim 11, wherein the light-absorbing layer has a trapezoidal appearance in the cross-sectional view.

18. The pixel package according to claim 11, wherein the upper conductive layer is surrounded by the light-absorbing layer.

19. The pixel package according to claim 11, wherein the carrier further comprises an insulating layer and a lower conductive layer, the insulating layer has the top surface, the lower conductive layer is arranged under the insulating layer and electrically connected to the upper conductive layer.

20. The pixel package according to claim 11, wherein a transmittance of the light-absorbing layer is less than 30%.

* * * * *